US009601550B2

(12) United States Patent
Seo et al.

(10) Patent No.: US 9,601,550 B2
(45) Date of Patent: Mar. 21, 2017

(54) ORGANIC LIGHT EMITTING DISPLAY DEVICE AND METHOD OF MANUFACTURING THE SAME

(71) Applicant: LG DISPLAY CO., LTD., Seoul (KR)

(72) Inventors: Hyun-Sik Seo, Goyang-si (KR); Jong-Woo Kim, Paju-si (KR); Kyung-Han Seo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/292,077

(22) Filed: May 30, 2014

(65) Prior Publication Data
US 2014/0353643 A1   Dec. 4, 2014

(30) Foreign Application Priority Data

May 30, 2013  (KR) .................. 10-2013-0061695
May 22, 2014  (KR) .................. 10-2014-0061909

(51) Int. Cl.
*H01L 27/32*  (2006.01)
*H01L 51/52*  (2006.01)
(Continued)

(52) U.S. Cl.
CPC ...... *H01L 27/3246* (2013.01); *H01L 27/1225* (2013.01); *H01L 27/1262* (2013.01);
(Continued)

(58) Field of Classification Search
CPC ... H01L 27/32–27/326; H01L 51/50–51/5012; H01L 51/525–51/5287;
(Continued)

(56) References Cited

U.S. PATENT DOCUMENTS 7,777,406 B2   8/2010  Son
2005/0088591 A1*  4/2005  Lee ................ G02F 1/13458
                                                         349/113
(Continued)

FOREIGN PATENT DOCUMENTS

CN  102122665 A  7/2011
CN  102427113 A  4/2012
(Continued)

OTHER PUBLICATIONS

European Search Report dated May 27, 2015 for corresponding European Application No. 14169839.9, 8 pages.
(Continued)

*Primary Examiner* — Earl Taylor
*Assistant Examiner* — Samuel Park
(74) *Attorney, Agent, or Firm* — Brinks Gilson & Lione

(57) ABSTRACT

An organic light emitting display device may include: a cell array comprising gate lines and data lines intersecting each other on a substrate so as to define a plurality of pixel areas, a plurality of thin film transistors formed at intersections between the gate lines and the data lines to correspond to the plurality of pixel areas, and a protective film evenly formed over the substrate to cover the thin film transistors; a plurality of first electrodes formed such that portions of an metal oxide layer corresponding to emission areas of the respective pixel areas, is made conductive, the metal oxide layer evenly disposed on the protective film; a bank constituting the remaining portion of the metal oxide layer in which the first electrodes are not formed and formed so as to have insulating properties; an emission layer formed over the metal oxide layer; and a second electrode formed on the emission layer so as to face the first electrodes.

8 Claims, 13 Drawing Sheets

(51) Int. Cl.
*H01L 27/12* (2006.01)
*H01L 51/56* (2006.01)
*H01L 51/00* (2006.01)

(52) U.S. Cl.
CPC ...... *H01L 51/0015* (2013.01); *H01L 51/0024* (2013.01); *H01L 51/5206* (2013.01); *H01L 51/56* (2013.01); *H01L 2251/308* (2013.01)

(58) Field of Classification Search
CPC .................... H01L 2227/32–2227/326; H01L 2251/5323–2251/5361; H01L 2924/12044
See application file for complete search history.

(56) References Cited

U.S. PATENT DOCUMENTS

| | | | |
|---|---|---|---|
| 2005/0275038 A1* | 12/2005 | Shih | H01L 29/78633 257/382 |
| 2007/0114521 A1* | 5/2007 | Hayashi | H01L 51/5237 257/40 |
| 2009/0212291 A1 | 8/2009 | Ikeda | |
| 2010/0237331 A1 | 9/2010 | Prakash | |
| 2011/0053347 A1* | 3/2011 | Shimomura | H01L 21/76254 438/458 |
| 2011/0073885 A1* | 3/2011 | Kim | H01L 27/3211 257/89 |
| 2012/0299116 A1* | 11/2012 | Takeuchi | G02F 1/13624 257/390 |
| 2013/0001533 A1* | 1/2013 | Kim | H01L 27/3248 257/40 |
| 2014/0217396 A1* | 8/2014 | Imamura | H01L 27/1225 257/43 |
| 2014/0353610 A1* | 12/2014 | Lee | H01L 51/504 257/40 |

FOREIGN PATENT DOCUMENTS

| | | |
|---|---|---|
| CN | 103035846 A | 4/2013 |
| WO | WO 2011/158185 A1 | 12/2011 |

OTHER PUBLICATIONS

Hohnholz, Dirk et al., "A Simple Method for the Subdivision of ITO Glass Substrates," Advanced Materials, vol. 11, No. 8, 1999, pp. 646-649.

Office Action dated Jul. 1, 2016 for Chinese Application No. 201410234660.6, 18 pages.

* cited by examiner

ORGANIC LIGHT EMITTING DISPLAY DEVICE AND METHOD OF MANUFACTURING THE SAME

This application claims the benefit of priorities to Korean Patent Application No. 10-2013-0061695, filed on May 30, 2013, and Korean Patent Application No. 10-2014-0061909, filed on May 22, 2014 which are hereby incorporated by reference as if fully set forth herein.

BACKGROUND

Field of the Disclosure

The present disclosure relates to an organic light emitting display device having a simplified structure and a method of manufacturing the same.

Discussion of the Related Art

With the advent of the information era, the field of displays, which visually display electrical information signals, has rapidly developed. Thus, research into a method of developing ultra-thin and lighter weight flat display devices with lower power consumption is continuously underway.

Examples of such flat display devices include, but are not limited to, a liquid crystal display (LCD) device, a plasma display panel (PDP) device, a field emission display (FED) device, an electroluminescent display (ELD) device, an electrowetting display (EWD) device, and an organic light emitting display device. Such flat display devices necessarily include flat display panels to display an image. A flat display panel has a structure in which a pair of substrates is adhered opposite each other with a luminescent or polarizing material disposed therebetween.

Among these display devices, organic light emitting display devices display an image using organic light emitting diodes (OLEDs), which are self-emissive. An OLED includes first and second electrodes facing each other and an emission layer formed therebetween and formed of an organic light emitting material, thus emitting light based on driving current flowing between the first and second electrodes.

In this regard, in the first electrode formed to correspond to an emission area of each of a plurality of pixel regions, current is concentrated at an edge portion of the first electrode where steps are formed, which is a cause of reduction in lifespan of an organic light emitting material.

Thus, to prevent reduction in lifespan of an emission layer due to steps of a first electrode, in general, a general organic light emitting display device further includes a bank that at least partially overlaps with an edge region of the first electrode. That is, the edge region of the first electrode is shielded by the bank and thus an organic light emitting material is not formed in the edge region of the first electrode and, accordingly, deterioration of the emission layer may be prevented.

However, since a general organic light emitting display device further includes a bank, there are limitations in thin film fabrication, reducing manufacturing costs and enhancing yield.

SUMMARY

An organic light emitting display device includes a substrate, a cell array including gate lines and data lines intersecting each other on the substrate so as to define a plurality of pixel areas, a plurality of thin film transistors formed at intersections between the gate lines and the data lines to correspond to the pixel areas, and a protective film evenly formed over an entire upper surface of the substrate to cover the thin film transistors, a plurality of first electrodes formed such that a portion of an metal oxide layer evenly disposed on the protective film, corresponding to an emission area of each of the pixel areas, is made conductive, a bank constituting the remaining portion of the metal oxide layer in which the first electrodes are not formed and formed so as to have insulating properties, an emission layer formed over an entire upper surface of the metal oxide layer, and a second electrode formed on the emission layer so as to face the first electrodes.

In another aspect of the present invention, a method of manufacturing an organic light emitting display device includes arranging a cell array including, on a substrate, gate lines and data lines intersecting each other so as to define a plurality of pixel areas, a plurality of thin film transistors corresponding to the pixel areas, and a protective film evenly formed and covering the thin film transistors, forming an metal oxide layer evenly on the protective film, forming a plurality of first electrodes such that a portion of the metal oxide layer corresponding to an emission area of each of the pixel areas is made conductive and forming a bank having insulating properties from the remaining portion of the metal oxide layer, forming an emission layer over an entire upper surface of the metal oxide layer, and forming a second electrode on the emission layer to face the first electrodes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EXEMPLARY EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic light emitting display device and a method of manufacturing the same according to embodiments of the present invention will be described in detail with reference to the accompanying drawings.

First, an organic light emitting display device according to various embodiments of the present invention will be described with reference to FIGS. 1 to 4.

Figure 1:
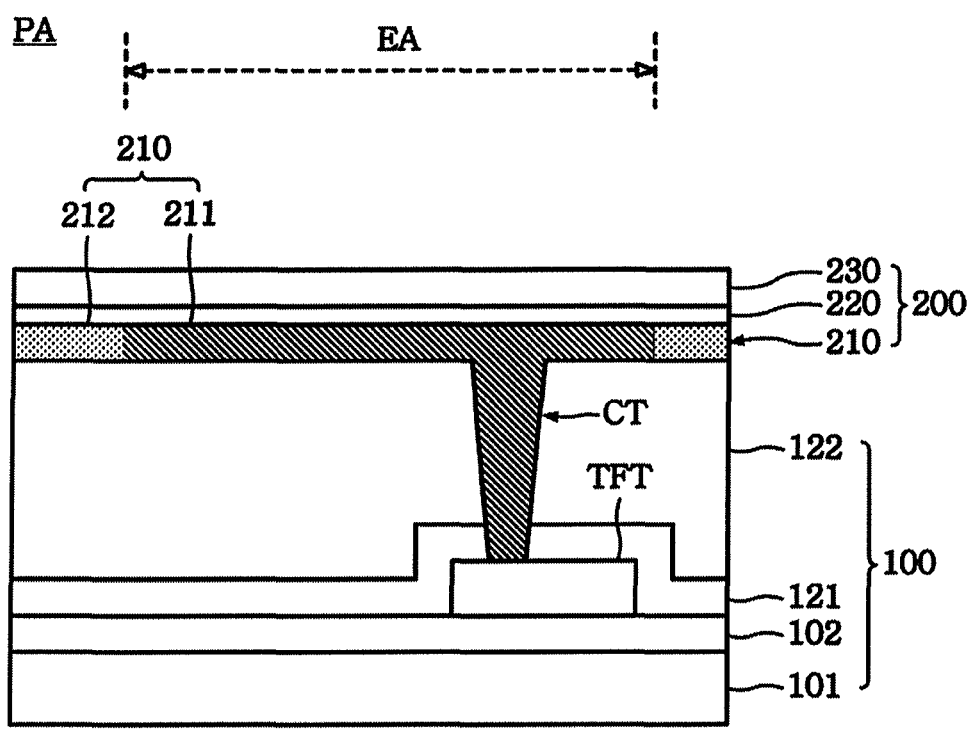
FIG. 1 is a sectional view illustrating any one of a plurality of pixel regions of an organic light emitting display device according to various embodiments of the present invention.
Figure 2:
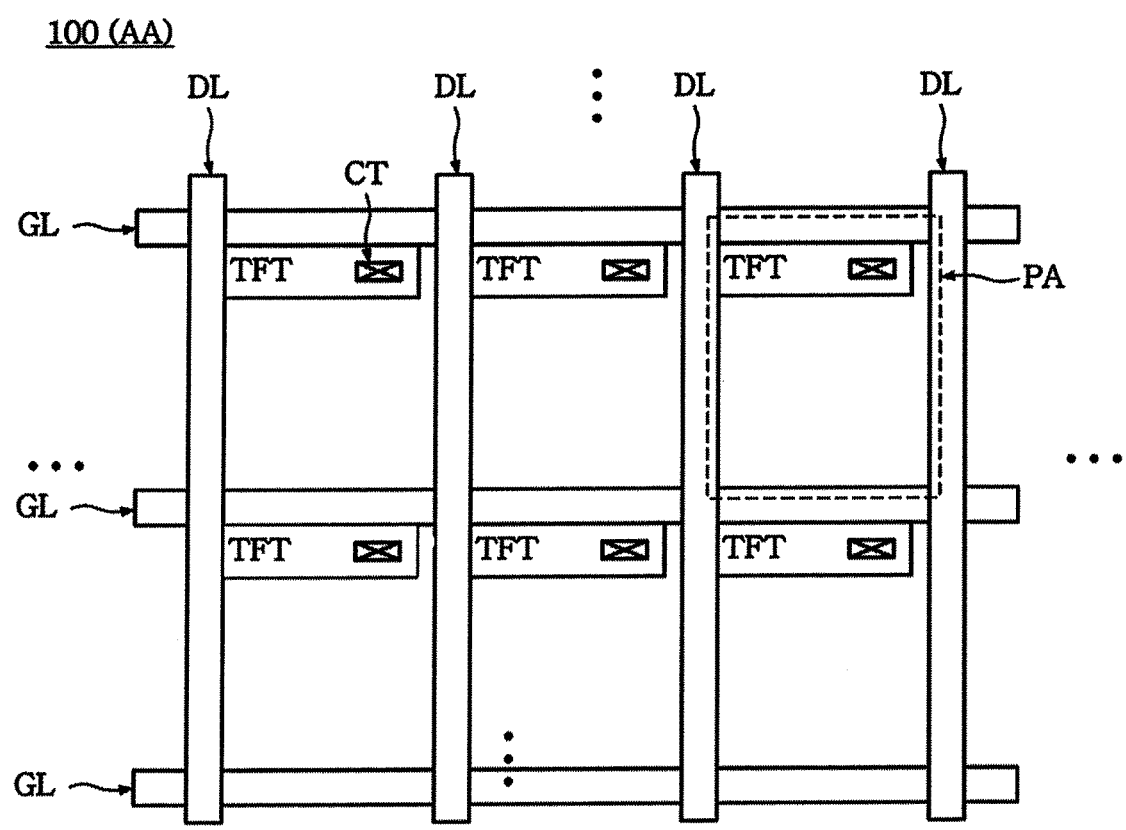
FIG. 2 is a plan view illustrating a cell array illustrated in FIG. 1.
Figure 3:
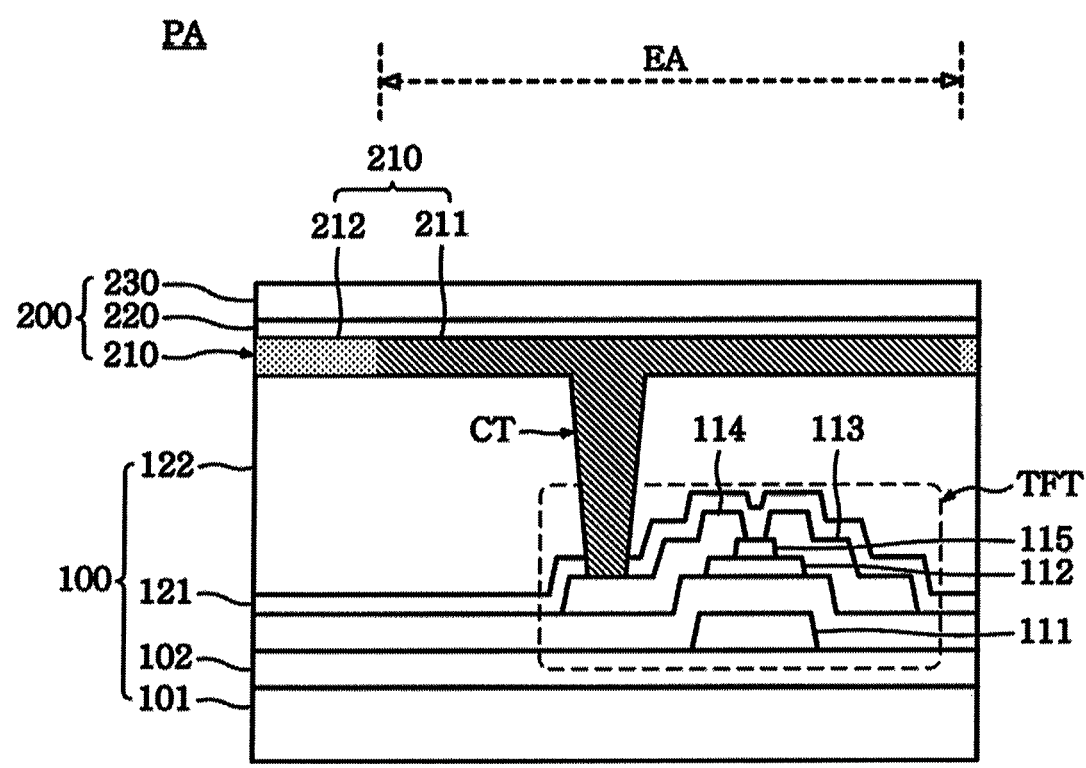
FIG. 3 is a sectional view of a thin film transistor illustrated in FIG. 1, according to various embodiments.
Figure 4:
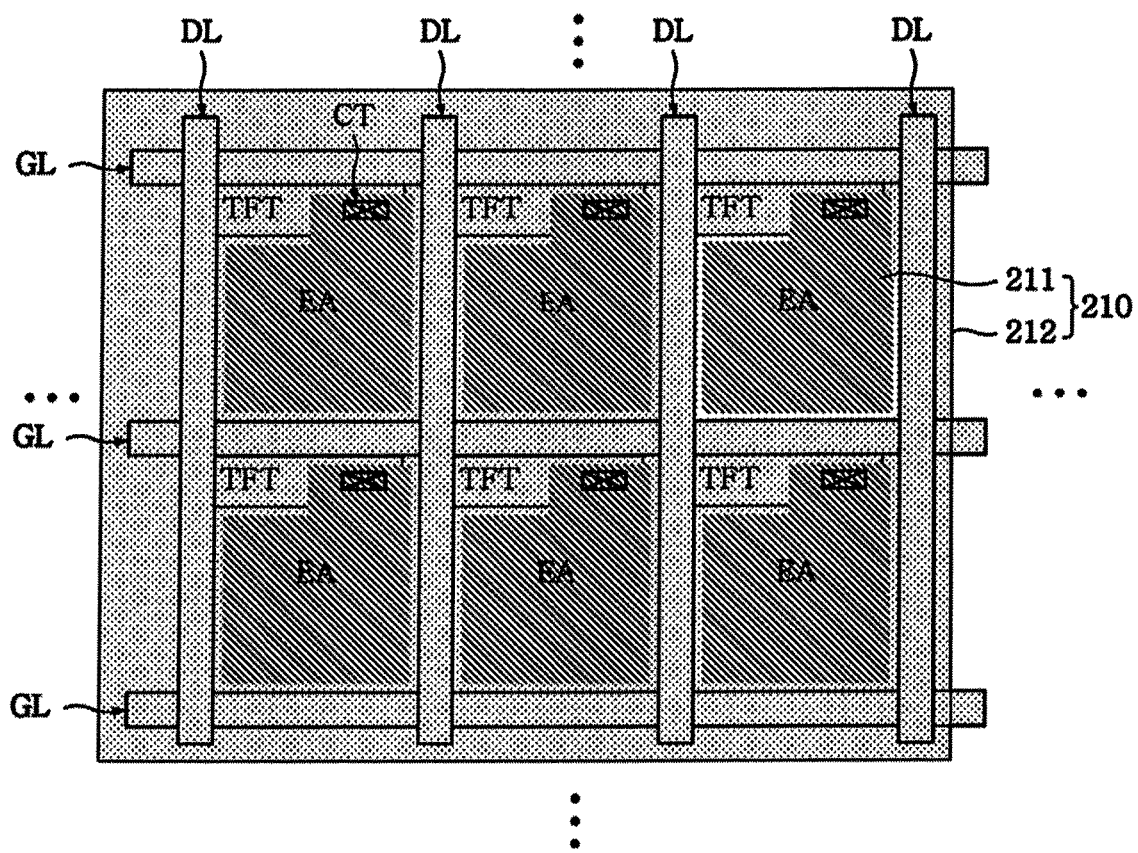
FIG. 4 is a plan view of an metal oxide layer illustrated in FIG. 1.

FIG. 1 is a sectional view illustrating any one of a plurality of pixel regions of an organic light emitting display device according to various embodiments of the present invention. FIG. 2 is a plan view illustrating a cell array illustrated in FIG. 1. FIG. 3 is a sectional view of a thin film transistor (TFT) illustrated in FIG. 1, according to various embodiments. FIG. 4 is a plan view of an metal oxide layer illustrated in FIG. 1.

As illustrated in FIG. 1, the organic light emitting display device according to various embodiments of the present invention includes a substrate 101, a cell array 100 formed on the substrate 101, and a light emitting device 200 formed on the cell array 100. In one or more embodiments, the term "cell array" may refer to an array of pixel cells of the display device.

As illustrated in FIG. 2, the cell array 100 corresponds to a display area AA, which substantially displays an image, among display surfaces. In addition, the cell array 100 includes gate lines GLs and data lines DLs that intersect each other so as to define a plurality of pixel areas PAs and a plurality of TFTs formed at the intersections between the gate lines GLs and the data lines DLs to correspond to the pixel areas PAs.

As illustrated in FIG. 3, each of the TFTs includes a gate electrode 111 formed on a buffer film 102 stacked over the entire upper surface of the substrate 101 to be connected to the gate line GL (see FIG. 2), a gate insulating film 103 formed over the entire upper surface of the buffer film 102 to cover the gate electrode 111, an active layer 112 formed on the gate insulating film 103 so as to overlap with at least a portion of the gate electrode 111, and source and drain electrodes 113 and 114 formed on the gate insulating film 103 to respectively overlap with opposite sides of the active layer 112 and to be spaced apart from each other.

The active layer 112 may be formed of a semiconducting material, for example any one of polysilicon, amorphous silicon, and an oxide semiconductor material.

The oxide semiconductor material is a combination material including metal and oxygen, i.e., a metallic oxide. The oxide semiconductor material includes $A_xB_yC_zO$ (wherein at least one of x, y, and z>0; e.g. x>0 and y=z=0; e.g. x and y>0 and z=0; e.g. x, y, and z>0), wherein A, B and C are each independently selected from Zn, Cd, Ga, In, Sn, Hf, and Zr. For example, the oxide semiconductor material may include any one selected from among In—Ga—Zn-Oxide (IGZO), In—Sn—Zn-Oxide (ITZO), and In—Ga-Oxide (IGO).

The oxide semiconductor material has the property that a carrier concentration ($cm^{-3}$) in the oxide semiconductor material corresponds to an oxygen ratio in a gas atmosphere, which is used for performing the deposition of the oxide semiconductor material. That is, when the oxygen ratio in the gas atmospheres increases, the oxide semiconductor material having a smaller carrier concentration is formed. In contrast, when the oxygen ratio in the gas atmosphere decreases, the oxide semiconductor material having a greater carrier concentration is formed. In general, an oxide semiconductor material having a carrier concentration of $10^{18}$ ($cm^{-3}$) or higher is perceived as a conductive material, an oxide semiconductor material having a carrier concentration of $10^{15}$ ($cm^{-3}$) or less is perceived as an insulating material, and an oxide semiconductor material having a carrier concentration in the range of $10^{15}$~$10^{18}$ ($cm^{-3}$) is perceived as semiconducting material.

Therefore, the active layer 112 is formed of the oxide semiconductor material deposited in gas atmosphere having some oxygen ratio which is adjusted in order that the oxide semiconductor material has the semiconducting properties.

Each TFT may further include an etch stopper layer 115 formed on at least a channel region of the active layer 112. When the active layer 112 is not a material which loses its semiconductor properties easily due to exposure to an etching gas or an etchant for forming the source and drain electrodes 113 and 114, each TFT may not include the etch stopper layer 115.

The TFTs are covered by an interlayer insulating film 121 and a protective film 122 sequentially formed to face the entire upper surface of the substrate 101. That is, the interlayer insulating film 121 is formed over the entire upper surface of the gate insulating film 103 to cover any one of the active layer 112 and the etch stopper layer 115 and the source and drain electrodes 113 and 114. In addition, the protective film 122 is formed over the entire upper surface of the interlayer insulating film 121 to have a flat upper surface.

In addition, any one of the source and drain electrodes 113 and 114 of each TFT is connected to the light emitting device 200 via a contact hole CT and the other thereof is connected to the data line DL (see FIG. 2) formed on the gate insulating film 103.

The contact hole CT is formed through at least the protective film 122 so as to expose a portion of any one of the source and drain electrodes 113 and 114. That is, when the interlayer insulating film 121 and the protective film 122 are sequentially stacked over the entire upper surface of the gate insulating film 103 so as to cover the TFTs, the contact hole CT is formed through the interlayer insulating film 121 and the protective film 122.

Although not shown, when there is no separate conductive layer (e.g., a color filter (CF) layer) between interlayer insulating film 121 and the protective film 122, the interlayer insulating film 121 may be omitted.

The light emitting device 200 includes a plurality of first electrodes 211 and a bank 212 that constitute the metal oxide layer 210 evenly disposed on the flat protective film 122, an emission layer 220 formed over the entire upper surface of the metal oxide layer 210, and a second electrode 230 formed on the emission layer 220 to face the first electrodes 211.

The metal oxide layer 210 is stacked on the protective film 122, having a flat upper surface, so as to have a flat upper surface.

The metal oxide layer 210 may be formed of an oxide semiconductor material including $A_xB_yC_zO$ (wherein at least one of x, y, and z>0; e.g. x>0 and y=z=0; e.g. x and y>0 and z=0; e.g. x, y, and z>0), wherein A, B and C are each independently selected from Zn, Cd, Ga, In, Sn, Hf, and Zr. For example, the metal oxide layer 210 may include any one selected from among In—Ga—Zn-Oxide (IGZO), In—Sn—Zn-Oxide (ITZO), and In—Ga-Oxide (IGO).

As described above, the oxide semiconductor material such as IGZO (In—Ga—Zn-Oxide), ITZO (In—Sn—Zn-Oxide) and IGO (In—Ga-Oxide), may be formed to have insulating properties by adjusting the oxygen ratio in the gas atmosphere that is used for performing the deposition of the oxide semiconductor material. For example, in accordance with some embodiments an oxygen ratio for forming the oxide semiconductor material, which has a carrier concentration of $10^{15}$ (cm$^{-3}$) or less and thus has insulating properties, is 9~10% in the gas atmosphere for performing the deposition of the oxide semiconductor material.

Also, after the oxide semiconductor material having insulating properties is formed, the insulating oxide semiconductor material is changed to conducting material by treatment. The treatment is performed in order to remove a number of oxygen (in other words, to reduce the oxygen content) in the insulating oxide semiconductor material, thereby increasing the carrier concentration of the oxide semiconductor material.

Using the properties of the oxide semiconductor material, the first electrodes 211 are formed by depositing a metal oxide layer 210 which is formed of oxide semiconductor material having insulating properties, and then making a portion of the metal oxide layer 210 corresponding to an emission area EA of each pixel area PA conductive. For example, the portion of the metal oxide layer 210 may have conductivity through plasma treatment, for example using a gas including at least one of Ar, N$_2$, NH$_3$ and H$_2$, thereby forming the first electrodes 211.

In addition, each first electrode 211 is connected to the TFT via a contact hole CT that passes through at least the protective film 122.

The bank 212 is the remaining portion of the metal oxide layer 210 in which the first electrodes 211 are not formed, i.e., the remaining portion that is not made conductive and maintains insulating properties.

In other words, as illustrated in FIG. 4, the portions of the metal oxide layer 210 corresponding to the emission areas EAs of the respective pixel areas PAs are made conductive to form the first electrodes 211 and the remaining portion thereof maintains insulating properties, thus forming the bank 212.

The emission layer 220 is formed over the metal oxide layer 210, i.e., on the first electrodes 211 and the bank 212 formed at edges of the first electrodes 211, using an organic light emitting material.

In this regard, the emission layer 220 may be formed of an organic light emitting material to emit light having the same wavelength. In other words, light emitted by the emission layer 210 may have the same wavelength (color) or wavelength spectrum (color spectrum) in each of the emission areas EAs. In this case, the organic light emitting display device further includes a color filter (CF) layer formed between the emission layer 220 and a light emitting surface. The CF layer may be configured to provide light of different colors, for example to provide pixels of different colors, e.g. red, green and blue pixels, in the organic light emitting display device.

For example, when the organic light emitting display device is of a bottom emission type to emit display light via the substrate 101, the organic light emitting display device may further include a CF layer (not shown) formed between the interlayer insulating film 121 and the protective film 122 to correspond to the emission area EA of each pixel area PA. On the other hand, when the organic light emitting display device is of a top emission type to emit display light via an optical path excluding the substrate 101, the organic light emitting display device may further include a CF layer (not shown) formed between the light emitting device 200 and a sealing layer (not shown) to correspond to the emission area EA of each pixel area PA. In this regard, the sealing layer (not shown) is configured to face the substrate 101 to prevent moisture or oxygen from permeating the light emitting device 200.

The second electrode 230 is formed over the emission layer 220. That is, the second electrode 230 is configured to face the first electrodes 211, with the emission layer 220 disposed therebetween.

As described above, according to various embodiments of the present invention, instead of being formed by selective etching of a separate conductive layer, the first electrodes 211 are formed as a portion of the metal oxide layer 210 evenly disposed on the protective film 122. In addition, the bank 212 that is formed as a portion of the metal oxide layer 210 and maintains insulating properties is arranged at edges of the first electrodes 211.

Through such configuration, steps are not formed by the first electrodes 211 and thus more rapid deterioration of the emission layer 220 than in other regions, caused when the organic light emitting material of the emission layer 220 is disposed on the edge region of each first electrode 211, is prevented.

In the organic light emitting display device according to various embodiments of the present invention, the edge region of each first electrode 211 is shielded, and thus, a bank formed as a separate insulating layer on the edge region of each first electrode 211 to overlap therewith so that an organic light emitting material is not deposited on the edge region of each first electrode 211 need not be formed.

Accordingly, it may be easy to thin the organic light emitting display device and manufacturing time and costs may be reduced, which results in enhanced yield.

Hereinafter, a method of manufacturing the organic light emitting display device according to various embodiments of the present invention will be described with reference to FIGS. 5 and 6A to 6H.

Figure 5:
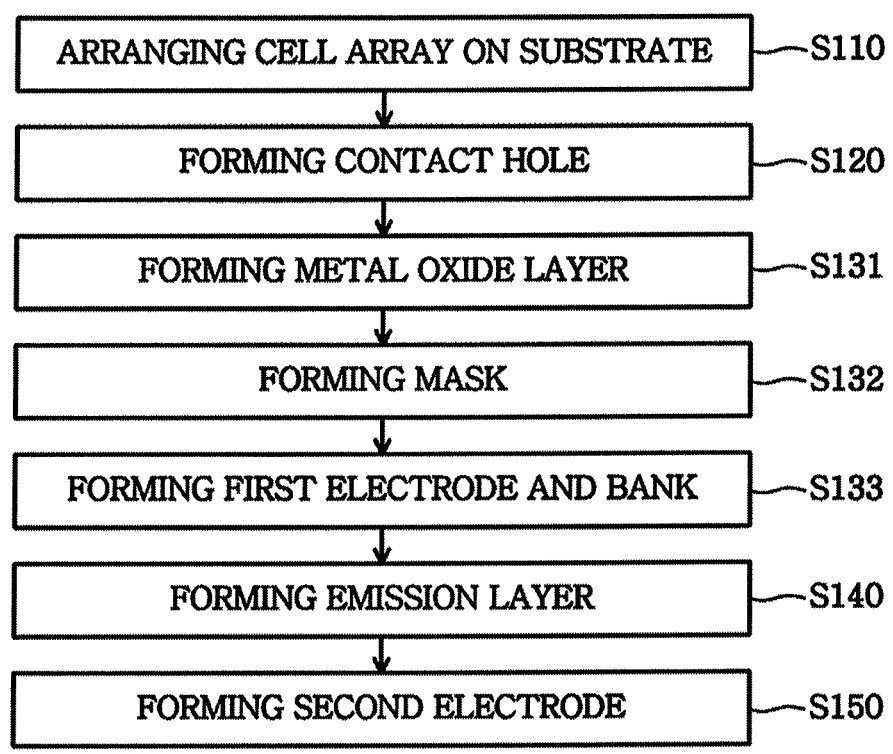
FIG. 5 is a flowchart illustrating a method of manufacturing an organic light emitting display device, according to various embodiments of the present invention.

FIG. 5 is a flowchart illustrating a method of manufacturing an organic light emitting display device, according to various embodiments of the present invention. FIGS. 6A to 6H are views sequentially illustrating processes of the method of FIG. 5.

As illustrated in FIG. 5, the method of manufacturing the organic light emitting display device according to various embodiments of the present invention includes arranging, on a substrate, a cell array including gate and data lines configured to define a plurality of pixel areas, a plurality of TFTs, and a protective film having a flat upper surface (step S110), forming a contact hole penetrating at least the protective film so as to expose a portion of each TFT (step S120), evenly forming an metal oxide layer on the flat protective film (step S130), forming, on the metal oxide layer, a mask including openings corresponding to emission areas of the respective pixel areas (step S141), forming a plurality of first electrodes and a bank by selectively performing plasma treatment on the metal oxide layer using the mask, in which portions of the metal oxide layer that have conductivity through plasma treatment, exposed via the openings corresponding to the emission areas of the respective pixel areas, form the first electrodes and the remaining portion thereof forms the bank (step S142), forming an emission layer over the entire upper surface of the metal oxide layer (step S150), and forming a second electrode on the emission layer so as to face the first electrodes (step S160).

Figure 6A:
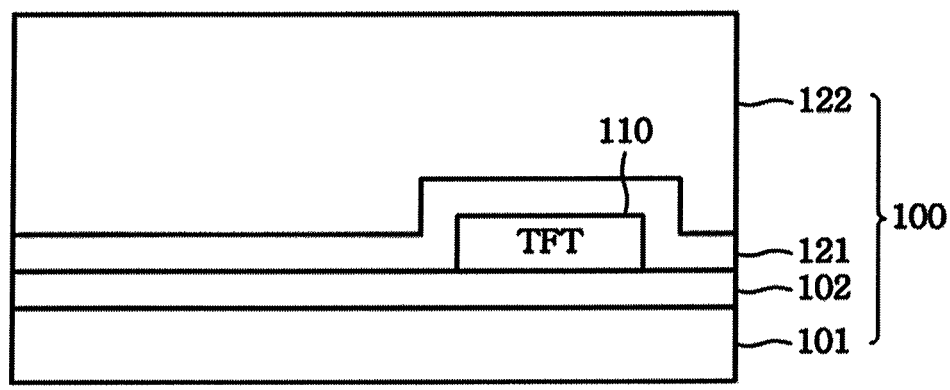
FIGS. 6A to 6H are views sequentially illustrating processes of the method of FIG. 5.

As illustrated in FIG. 6A, the cell array 100 is formed on the substrate 101 (step S110).

In this regard, before forming the cell array 100, a buffer layer 102 to prevent moisture or oxygen from permeating the substrate 101 may be further formed.

The cell array 100 includes TFTs corresponding to the pixel areas PA and the protective film 122 having a flat upper surface that is formed over the entire upper surface of the substrate 101 to cover the TFTs.

Referring to FIG. 2, the cell array 100 includes gate lines GLs and data lines DLs that intersect each other so as to define the pixel areas PAs and the TFTs formed at the intersections between the gate lines GLs and the data lines DLs to correspond to the pixel areas PAs.

Referring to FIG. 3, the arranging (step S110) includes forming the gate lines GLs (see FIG. 2) and the gate electrode 111 connected to the gate line GL on the buffer film 102 disposed over the entire upper surface of the substrate 101, forming the gate insulating film 103 over the entire upper surface of the buffer film 102 to cover the gate lines GLs and the gate electrodes 111, forming the active layer 112 on the gate insulating film 103 so as to overlap with at least a portion of the gate electrode 111, forming the etch stopper layer 115 on at least a channel region of the active layer 112, and forming, on the gate insulating film 103, the data lines DLs (see FIG. 2) and the source and drain electrodes 113 and 114 that respectively overlap with opposite sides of the active layer 112 and are spaced apart from each other.

In addition, the arranging (step S110) further includes forming the protective film 122 over the entire upper surface of the substrate 101, i.e., over the entire upper surface of the gate insulating film 103, so as to cover the TFTs and have a flat upper surface.

Moreover, the arranging (step S110) may further include, before forming the protective film 122, forming the interlayer insulating film 121 on the entire upper surface of the gate insulating film 103 to cover the TFTs.

Figure 6B:
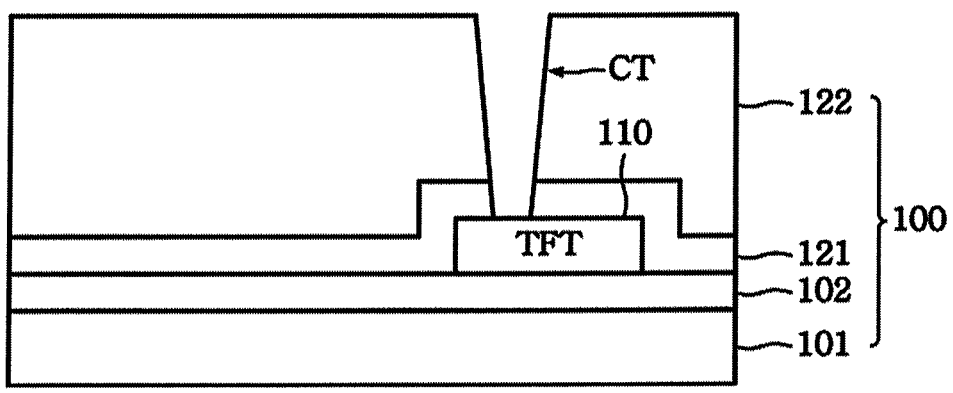

As illustrated in FIG. 6B, the contact hole CT that passes through at least the protective film 122 is formed so as to expose a portion of any one of the source and drain electrodes 113 and 114 of each TFT which is not connected to the data line DL (step S120).

Figure 6C:
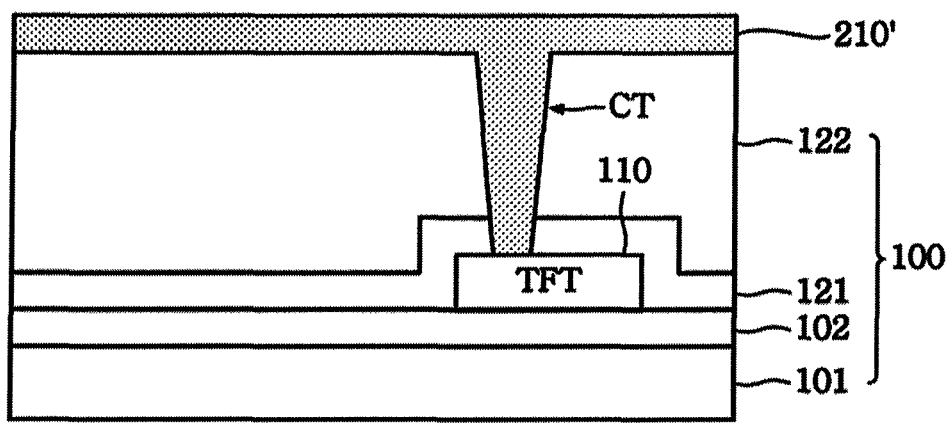

As illustrated in FIG. 6C, the metal oxide layer 210 having insulating properties is evenly formed over the entire upper surface of the flat protective film 122 (step S130).

The metal oxide layer 210 is formed of a combination material including metal and oxide, in particular, the oxide semiconductor material including $A_xB_yC_zO$ (wherein at least one of x, y, and z>0; e.g. x>0 and y=z=0; e.g. x and y>0 and z=0; e.g. x, y, and z>0), wherein A, B and C are each independently selected from Zn, Cd, Ga, In, Sn, Hf, and Zr. For example, the metal oxide layer 210 may include any one selected from among In—Ga—Zn-Oxide (IGZO), In—Sn—Zn-Oxide (ITZO), and In—Ga-Oxide (IGO).

In this regards, the metal oxide layer 210 may be deposited in a gas atmosphere including 9~30% (e.g., 9~10%) of oxygen ratio so that the metal oxide layer 210 has insulating properties.

In addition, the metal oxide layer 210 may be formed to fill the contact hole CT of each pixel area PA.

Figure 6D:
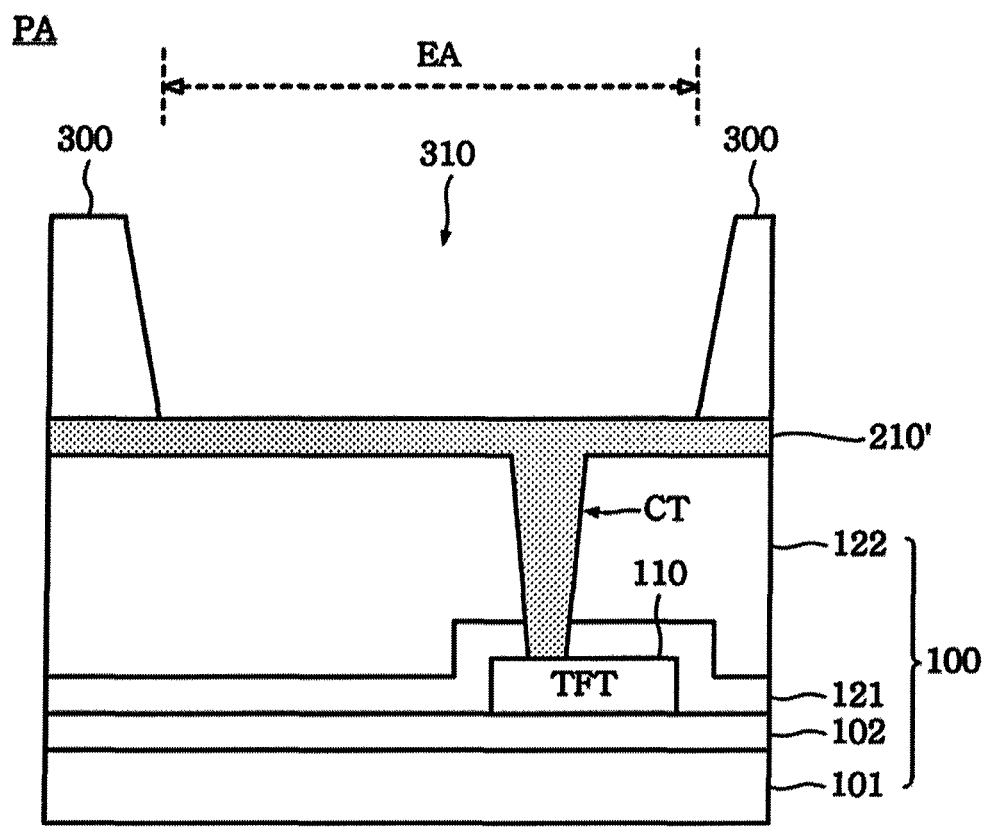

Next, as illustrated in FIG. 6D, a mask 300 having openings 310 corresponding to the emission areas EAs of the respective pixel areas PAs is formed on the metal oxide layer 210 (step S141).

Figure 6E:
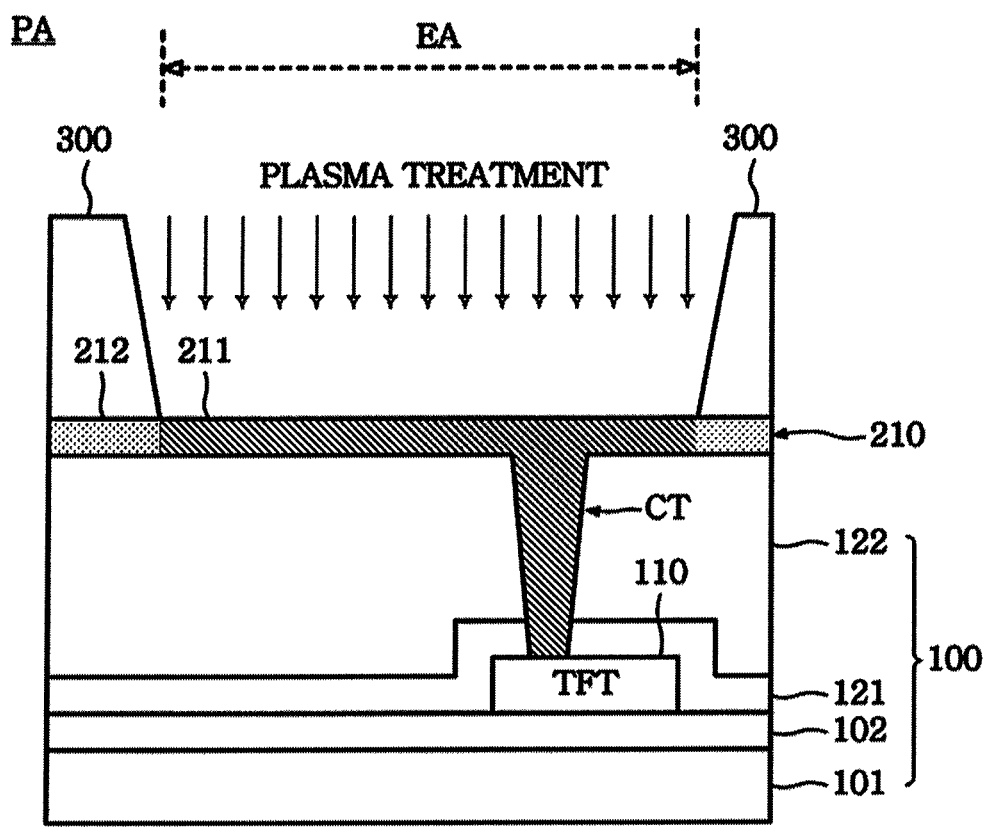

As illustrated in FIG. 6E, plasma treatment is performed on portions of the metal oxide layer 210 that are exposed via the openings 310, using the mask 300. In this regard, the portions of the metal oxide layer 210 on which plasma treatment is performed are made conductive, thereby forming the first electrodes 211. In addition, the remaining portion of the metal oxide layer 210 on which plasma treatment is not performed maintains insulating properties, thereby forming the bank 212 (step S142).

In this regard, selective plasma treatment of the metal oxide layer 210 may be performed using a gas including at least one of Ar, $N_2$, $NH_3$, and $H_2$ so as to form the first electrode 212.

For example, as illustrated in below Table 1, the metal oxide layer 210 may be formed of the oxide semiconductor material which is deposited in a gas atmosphere including 9~30% (e.g., 9~10%) of oxygen ratio, thereby to be an insulating material having $10^8$ ($\Omega$/square) or more of resistance. If the metal oxide layer 210 including insulating oxide semiconductor material is exposed to treatment of each condition for 1~50 seconds, the metal oxide layer 210 is changed to a conducting material having 700~1000 ($\Omega$/square) of resistance. The oxide semiconductor material in the example of Table 1 includes a-IGZO which has 700 Å of thickness, and is deposited in gas atmosphere including 9.4% of oxygen ratio and room temperature (R.T). The reaction pressure of the treatment is 0.5~1.5 torr.

TABLE 1

| Status | resistance ($\Omega$/square) |
| --- | --- |
| insulating oxide semiconductor material is deposited | $10^8$ and more |
| performing the $H_2$ plasma treatment using a gas including 320 sccm of $NH_3$ and 900 sccm of $H_2$ to the oxide semiconductor material | 903.9 |
| performing the $H_2$ plasma treatment using a gas including 160 sccm of $NH_3$ and 500 sccm of $H_2$ to the oxide semiconductor material | 908.7 |
| performing the $H_2$ plasma treatment using a gas including 80 sccm of $NH_3$ and 250 sccm of $H_2$ to the oxide semiconductor material | 1042 |

Figure 6F:
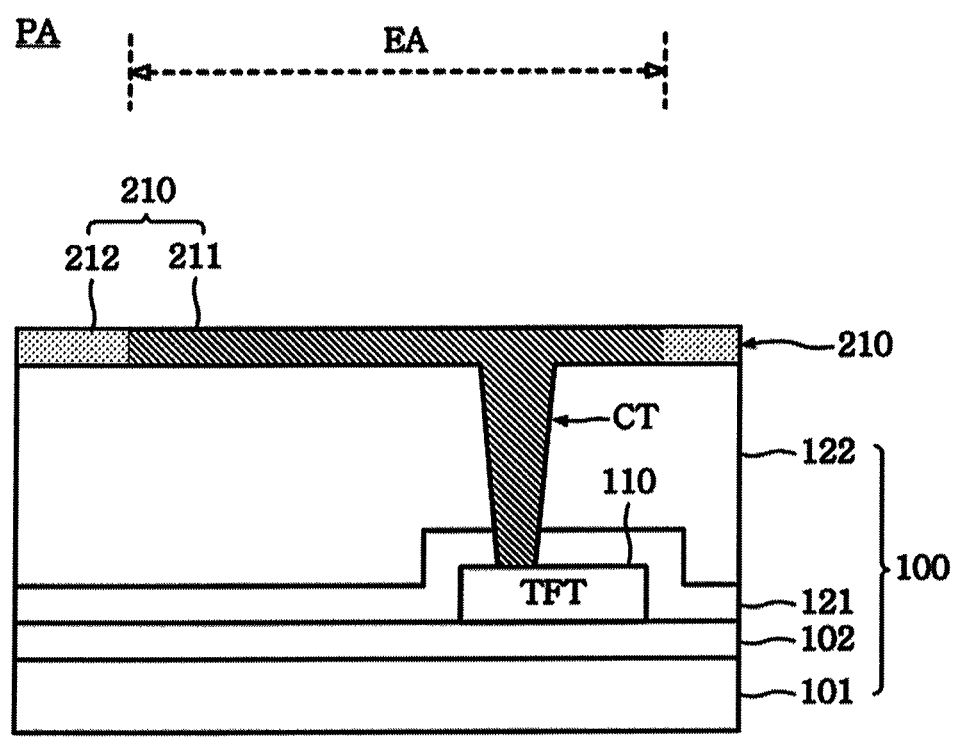
Figure 6G:
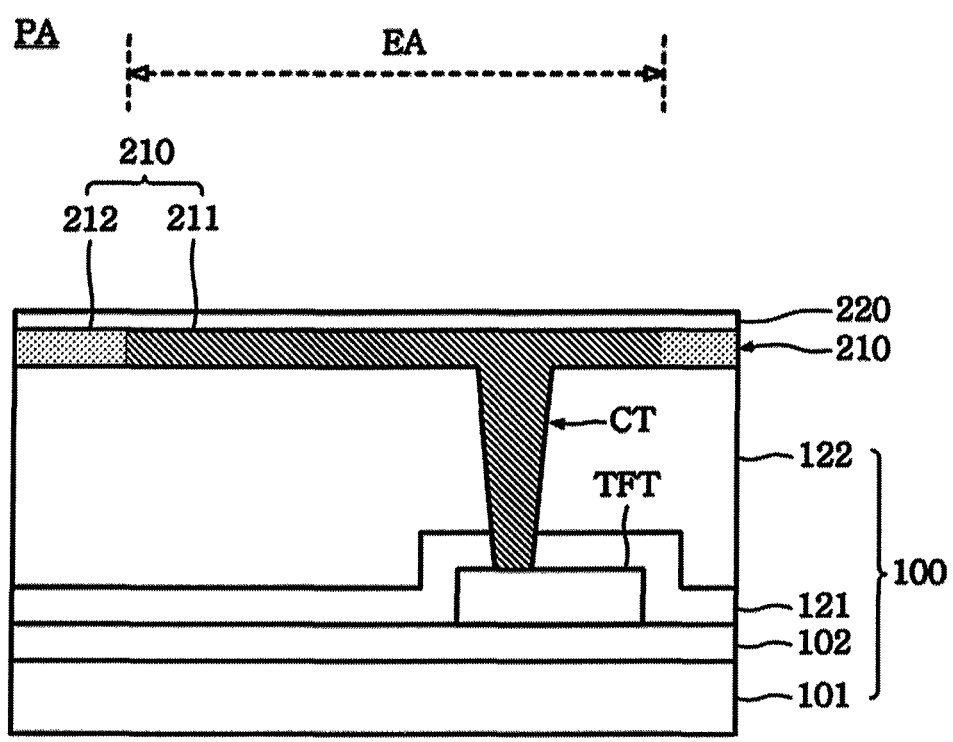

As illustrated in FIG. 6F, the mask 300 (see FIG. 6E) is removed and then, as illustrated in FIG. 6G, the emission layer 220 is formed by depositing an organic light emitting material over the entire upper surface of the metal oxide layer 210, i.e., on the first electrodes 211 and the bank 212 (step S150).

Figure 6H:
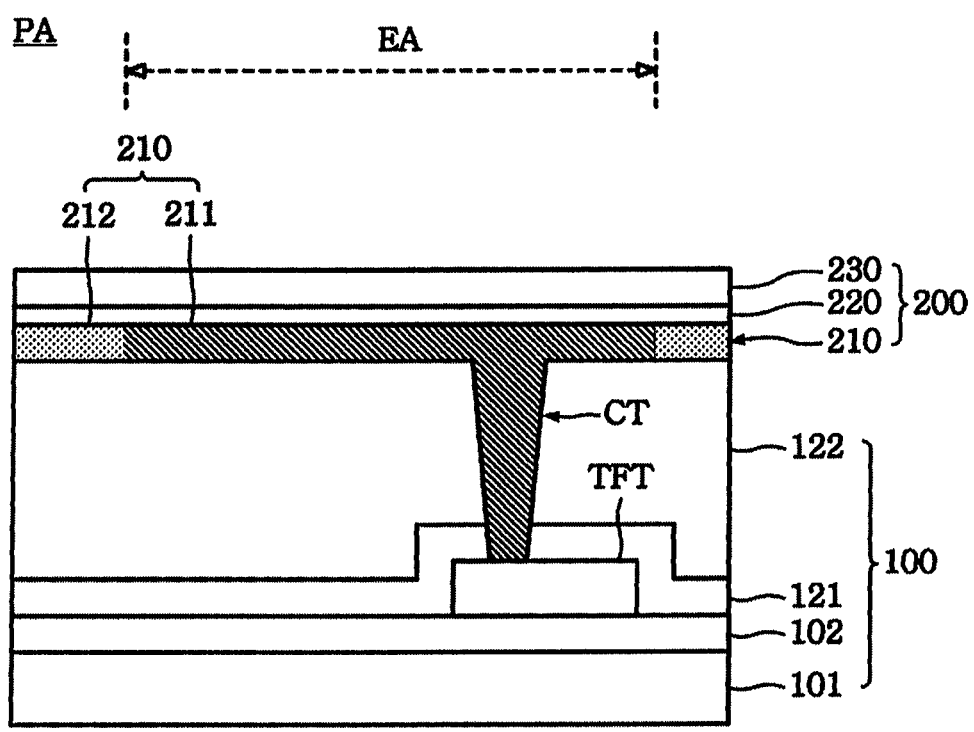

As illustrated in FIG. 6H, the second electrode 230 facing the first electrodes 211 is formed on the emission layer 220 (step S160).

As described above, according to various embodiments of the present invention, portions of the metal oxide layer 210 that is evenly disposed on the flat protective film 122 so as to have insulating properties, corresponding to the emission areas EAs of the respective pixel areas PAs, are subjected to selective plasma treatment. Through this process, the portions of the metal oxide layer 210, having conductivity through plasma treatment, form the first electrodes 211, and the remaining portion of the metal oxide layer 210 that is not subjected to plasma treatment and maintains insulating properties forms the bank 212.

Thus, it is unnecessary to perform a process of forming and patterning a separate insulating layer to form a bank and, accordingly, manufacturing time and costs may be further reduced, which results in further enhancement of yield.

According to various embodiments of the present invention, an organic light emitting display device includes first electrodes formed such that portions of a metal oxide layer formed on a flat upper surface of a cell array, corresponding to emission areas of respective pixel areas, are made conductive. According to various embodiments the metal oxide layer may be a layer that includes, or is made of, an oxide semiconductor material.

The first electrodes are not formed by selective etching, and thus, steps that cause deterioration of an emission layer do not occur. Thus, a bank formed as a separate insulating layer on edge regions of the first electrodes to overlap therewith is not needed.

In addition, the metal oxide layer is formed in a state of having insulating properties and has conductivity through a separate process. Through this process, the remaining portion of the metal oxide layer in which the first electrodes are not formed maintains insulating properties, thereby forming a bank.

Through such configuration, an organic light emitting device does not include a bank formed as a separate insulating film and thus may be more desirable in terms of thin film fabrication.

The first electrode 211 is formed of the oxide semiconductor material having conducting properties through treatment and the first electrode 211 is connected to the TFT via contact hole CT that passes through at least the protective film 122. However, when the oxide semiconductor material of the first electrode 211 may be not deposited inside the contact hole CT, or when the treatment may be not performed to the oxide semiconductor material inside the contact hole CT, thus reliance on the electrical connection of the first electrode 211 and the TFT may be decreased.

Therefore, an organic light emitting display device according to another various embodiments of the present invention, further includes a sub-electrode formed between the first electrode 211 and the protective film 122.

Figure 7:
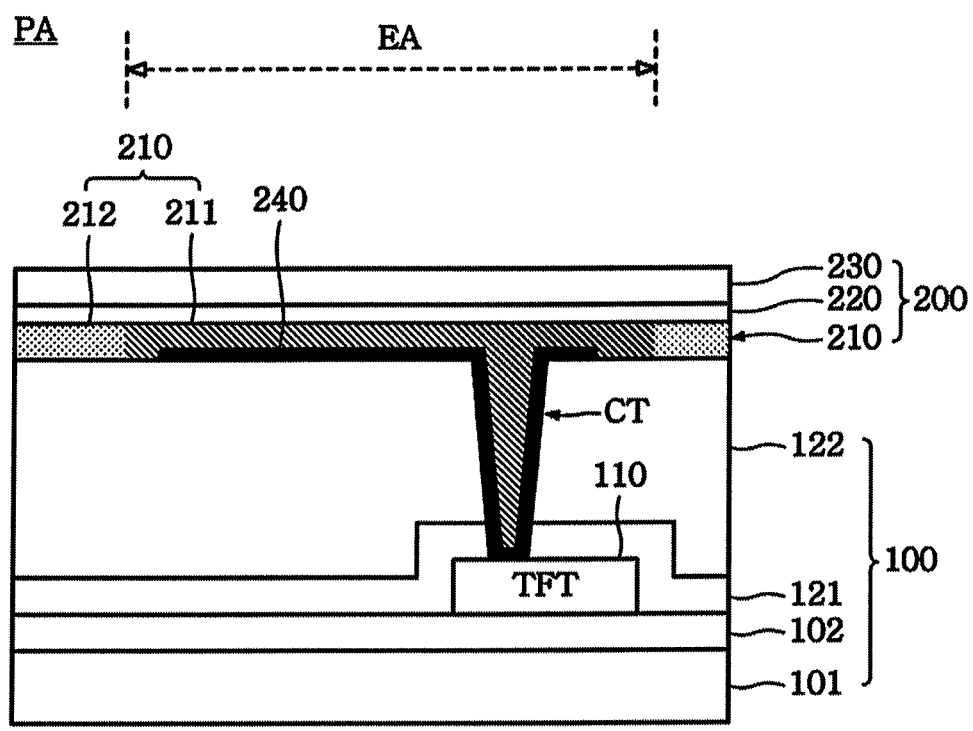
FIG. 7 is a sectional view illustrating any one of a plurality of pixel regions of an organic light emitting display device according to another embodiment of the present invention.

FIG. 7 is a sectional view illustrating any one of a plurality of pixel regions of an organic light emitting display device according to another embodiment of the present invention. As illustrated in FIG. 7, the organic light emitting display device according to another various embodiments of the present invention, is identical with the organic light emitting display device according to various embodiments of the present invention as illustrated in FIGS. 1-3 and 5 except of further including the sub-electrode 240.

The sub-electrode 240 corresponds to the emission area EA of each pixel area PA, and is formed between the protective film 122 and the first electrode 211. The sub-electrode 240 is formed to cover at least the contact hole CT and surrounding of the contact hole CT.

The sub electrode 240 is formed as thin film of metal. For example, the sub electrode 240 is formed of any one of MoTi, ITO and Al.

The thickness of the sub electrode 240 is thinner than the thickness of the metal oxide layer 210 so that the shape of the sub electrode 240 may not be transferred to the metal oxide layer 210. For example, the sub electrode 240 includes 100~500 Å of thickness, and the metal oxide layer 210 includes 900~1500 Å of thickness.

A method of manufacturing the organic light emitting display device according to another various embodiments of the present invention is identical with the organic light emitting display device according to various embodiments of the present invention as illustrated in FIGS. 6 and 7A-7H, except of further including depositing metallic thin film and patterning the metallic thin film so that the sub-electrode 240 corresponding to the emission area EA of each pixel area PA, and corresponding to at least the contact hole CT and surrounding of the contact hole CT before forming metal oxide layer 210 (S131) and after forming the contact hole CT (S 120).

According to another various embodiments of the present invention, reliance on the electrical connection of the first electrode 211 and the TFT may be improved by the sub-electrode 240, and the resistance of the first electrode 211 may be decreased by the sub-electrode 240. But also, the thickness of the device may be not increased by the sub-electrode 240.

In addition, a method of manufacturing the organic light emitting display device need not include a process of forming and patterning a separate insulating film to form a bank, and thus, manufacturing time and costs may be reduced, which results in enhanced yield.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
a substrate;
a cell array comprising gate lines and data lines intersecting each other on the substrate so as to define a plurality of pixel areas, a plurality of thin film transistors formed at intersections between the gate lines and the data lines to correspond to the plurality of pixel areas, and a protective film evenly formed over the substrate to cover the plurality of thin film transistors;
a metal oxide layer disposed on the protective film, consisting of a plurality of first electrodes and insulating portions arranged at both sides of each of the plurality of the first electrodes, wherein an upper surface of the plurality of the first electrodes and an upper surface of the insulating portions of the metal oxide layer are coplanar;
a planar emission layer evenly disposed directly on the entire upper surface of the insulating portions and the entire upper surface of the plurality of the first electrodes of the metal oxide layer; and
a second electrode on the emission layer.

2. The organic light emitting display device according to claim 1, wherein the metal oxide layer comprises $A_xB_yC_zO$ (x, y, z>0), wherein A, B and C are each independently selected from among Zn, Cd, Ga, In, Sn, Hf, and Zr.

3. The organic light emitting display device according to claim 2, wherein the metal oxide layer comprises one selected from among In—Ga—Zn-Oxide (IGZO), In—Sn—Zn-Oxide (ITZO), and In—Ga-Oxide (IGO).

4. The organic light emitting display device according to claim 1, wherein each of the plurality of the thin film transistors comprises:
a gate electrode on the substrate to be connected to the gate line;
an active layer on a gate insulating film covering the gate electrode so as to overlap with at least a portion of the gate electrode; and source and drain electrodes on the gate insulating film so as to respectively overlap with opposite sides of the active layer and be spaced apart from each other, and wherein the plurality of the thin film transistors are covered by the protective film formed over the gate insulating film.

5. The organic light emitting display device according to claim 4, wherein one of the source and drain electrodes is connected to the first electrode via a contact hole passing through the protective film, and the other one of the source and drain electrodes is connected to the data line.

6. The organic light emitting display device according to claim 5, further comprising:

a sub-electrode corresponding to emission area of each pixel area, formed between the first electrode and the protective film to cover at least the contact hole.

7. The organic light emitting display device according to claim 1, wherein a contact hole is formed through the protective film to expose a portion of a corresponding thin film transistor, each of the plurality of the first electrodes having a portion filling in the contact hole.

8. The organic light emitting display device according to claim 1, wherein each of the plurality of the first electrodes has a sheet resistance under $10^3$ Ω/square, and each of the insulating portions of the metal oxide layer has a sheet resistance over $10^8$ Ω/square.

* * * * *